United States Patent [19]
Nenyei et al.

[11] Patent Number: 6,100,149
[45] Date of Patent: Aug. 8, 2000

[54] METHOD FOR RAPID THERMAL PROCESSING (RTP) OF SILICON SUBSTRATES

[75] Inventors: Zsolt Nenyei; Wilfried Lerch, both of Blaustein; Helmut Sommer, Deggingen, all of Germany

[73] Assignee: Steag RTP Systems, Germany

[21] Appl. No.: 08/886,215

[22] Filed: Jul. 1, 1997

[51] Int. Cl.$^7$ .................................................. H01L 21/336
[52] U.S. Cl. ........................ 438/308; 438/761; 438/763; 438/778
[58] Field of Search .................................. 438/761, 763, 438/778

[56] References Cited

U.S. PATENT DOCUMENTS

| | | |
|---|---|---|
| 4,626,450 | 12/1986 | Akimiko et al. . |
| 4,784,975 | 11/1988 | Hofmann et al. . |
| 5,279,973 | 1/1994 | Yasumassa . |
| 5,498,577 | 3/1996 | Fulford, Jr. et al. . |

FOREIGN PATENT DOCUMENTS 0 742593  11/1996  European Pat. Off. .

OTHER PUBLICATIONS

Copel et al., Effects of surface oxide on rapid thermal nitradation of Si(001), Journal of Vacuum Science Technology A, vol. 14, Issue 2, pp. 462–462, Mar. 1996.

Bauer et al., Structural and electrical properties of thin SiO[sub 2] layers grown by RTP in a mixture of N[sub 2]O and O[sub 2], Journal of non–Crystalline Solids, vol. 187, pp. 361–364, 1995.

Hofmann et al., Hole trapping in SiO[sub 2] films annealed in low–pressure oxygen atmosphere, Journal of Applied Physics, vol. 62(3), pp. 925–930, Aug. 1, 1987.

Rubloff et al., Defect Microchemistry in the SiO[sub 2]/Si Interface, Physical Review Letters, pp. 2379–2382, 1987.

Lu et al., Rapid thermal N[sub 2]O oxinitride on Si(100), Journal of Vacuum Science Technology B, pp. 2882–2887, Jul. 1996.

Ting et l., Composition and growth kinetics of ultrathin SiO[sub 2] films formed by oxidizing Si substrates in N[sub 2]O, Applied Physics Letters, vol. 57 (26), pp. 2808–2810, 1990.

Hofmann et al., Defect formation in thermal SiO[sub 2] by high–temperature annealing, Applied Physics Letters, vol. 49 (22) pp. 1525–1527, 1986.

Hussey, R.J., et al., A study of nitrogen incorporation during the oxidation of Si(100) in N[sub 2]O at high–temperatures, Journal of the Electrochemical Society, vol. 143, No. 1, pp. 221–228, Jan. 1996.

Z. Nenyei et al. "gas flow engineering in rapid thermal processing" Rapid Thermal and Integrated Processign III Symposium, San Francisco, CA, USA Apr. 4–7, 1994 pp. 401–406 Publisher—Materials Research Society, Pittsburgh, PA.

*Primary Examiner*—John F. Niebling
*Assistant Examiner*—Jonathan Hack
*Attorney, Agent, or Firm*—Rodney T Hodgson

[57] ABSTRACT

A method of rapid thermal processing (RTP) of a silicon substrate is presented, where a very low partial pressure of reactive gas is used to control etching and growth of oxides on the silicon surface.

17 Claims, 3 Drawing Sheets

METHOD FOR RAPID THERMAL PROCESSING (RTP) OF SILICON SUBSTRATES

FIELD OF THE INVENTION

The present invention relates to a method for the rapid thermal processing (RTP) of sensitive electronic materials.

BACKGROUND OF THE INVENTION

Rapid Thermal Processing (RTP) is a versatile optical heating method which can be used for semiconductor processing as well as a general, well controlled, method for heating objects or wafers which are in the form of thin sheets, slabs, or disks. The objects are generally inserted one at a time into a chamber which has at least some portions of the chamber walls transparent to transmit radiation from powerful heating lamps. The transparent portion of the walls is generally quartz, which will transmit radiation up to a wavelength of 3 to 4 microns. These lamps are generally tungsten-halogen lamps, but arc lamps or any other source of visible and/or near infrared radiation may be used. The radiation from the lamps is directed through the transparent portions of the walls on to the flat surface of the object to be heated. Radiation may be directed on to the flat surface of the object from one side or the other, or both sides simultaneously. As long as the objects absorb light in the near infrared or visible spectral region transmitted by the transparent portion of the walls, RTP techniques allow fast changes in the temperature and process gas for the different material processes and conditions. Since the flat surface of a semiconductor wafer may be uniformly irradiated, the entire wafer may be heated with relatively little temperature difference across the wafer during the entire time of heating, and hence little slip occurs. RTP allows the "thermal budgets" of the various semiconductor processing to be reduced, as well as allows the production of various metastable states which can be "frozen in" when the material is cooled rapidly.

RTP systems are relatively new. In the last 10 or 15 years, such systems were used only in research and development. The thrust of the work was increasing the temperature uniformity, and developing heating cycles and processes which decreased the thermal budget. Prior art RTP machines can heat unstructured, homogeneous materials in the form of a flat plate or disk, and produce temperature uniformities across the plate adequate for semiconductor processing processes.

The temperature control in current RTP systems is mostly performed by monochromatic (or narrow wavelength band) pyrometry measuring temperature of the relatively unstructured and featureless backside of semiconductor wafers. The results of the temperature measurement are generally used in a feedback control to control the heating lamp power. Backside coated wafers with varying emissivity can not be used in this way, however, and the backside layers are normally etched away or the temperature is measured using contact thermocouples.

A newer method of temperature control is the power controlled open loop heating described in U.S. Pat. No. 5,359,693, which patent is hereby incorporated by reference.

German patent DE42 23 133 C2, hereby incorporated by reference, discloses a method of producing relatively defect free material in RTP machines. Apparatus induced thermal inhomogeneities have been reduced in the last few years because of the demand for more uniform processing. Among the techniques used have been control of the individual lamp power, use of circular lamps, and rotation of the semiconductor wafers with independent power control.

Most RTP machines have a thin rectangular quartz reaction chamber having one end open. Chambers meant for vacuum use often have a flattened oval cross section. Chambers could even be made in the form of a flat cylindrical pancake. In general, the chambers are used so that the thin objects to be heated are held horizontally, but they could also be held vertical or in any convenient orientation. The reactor chamber is usually thin to bring the lamps close to the object to be heated. The reactor chamber is opened and closed at one end with a pneumatically operated door when the wafer handling system is in operation. The door is usually made of stainless steel, and may have a quartz plate attached to the inside. The process gas is introduced into the chamber on the side opposite the door and exhausted on the door side. The process gas flow is controlled by computer controlled valves connected to various manifolds in a manner well known in the art.

In the march of semiconductor technology to ever smaller device dimensions and ever larger wafer sizes, the depths of implant of dopant atoms is getting more and more shallow, and the allowed tolerances for implant dose and movement of these dopant atoms is getting tighter and tighter. Rapid thermal processing has allowed engineers to keep to the tighter tolerances since the processing can be done at the optimum temperature for the particular process, while spending very little time at other temperatures on the way up and on the way down in the temperature vs time curve.

We have found, however, a previously unrecognized problem in the processing of silicon devices having bare silicon surfaces, or only a native oxide or with very thin gate and tunnel oxides. The processing itself seems to change the distribution and the amount of dopant in some cases. We have found that previous process gas compositions sometimes lead to such problems, and that proper specification of the process gas composition for each particular type of wafer, temperature, and time combination, can result in much improved uniformity of the devices produced using the RTP process.

RELATED APPLICATIONS

Reactors based on the RTP principle often have the entire cross section of one end of the reactor chamber open during the wafer handling process. This construction has been established because the various wafer holders, guard rings, and gas distribution plates, which have significantly greater dimensions and may be thicker than the wafers, must also be introduced into the chamber and must be easily and quickly changed when the process is changed or when different wafer sizes, for example, are used. The reaction chamber dimensions are designed with these ancillary pieces in mind. U.S. patent application 08/387,220, now U.S. patent No., assigned to the assignee of the present invention and hereby incorporated by reference, teaches the importance of the gas flow and the use of an aperture in the door to regulate gas flow and control impurities in the process chamber.

The wafer to be heated in a conventional RTP system typically rests on a plurality of quartz pins which hold the wafer accurately parallel to the reflector walls of the system. Prior art systems have rested the wafer on an instrumented susceptor, typically a uniform silicon wafer. Copending U.S. patent application Ser. No. 08/537,409, assigned to the assignee of the present invention, hereby incorporated by reference, teaches the importance susceptor plates separated from the wafer.

Rapid thermal processing of III–IV semiconductors has not been as successful as RTP of silicon. One reason for this is that the surface has a relatively high vapor pressure of for example, arsenic (As) in the case of gallium arsenide (GaAs). The surface region becomes depleted of As, and the material quality suffers. Copending patent application Ser. No. 08/631,265, assigned to the assignee of the present invention, hereby incorporated by reference, supplies a method and apparatus for overcoming this problem.

OBJECTS OF THE INVENTION

It is an object of the invention to provide a method of processing a semiconductor substrate so that tolerances for dopant amount and dopant position can be met.

It is an object of the invention to provide a method of processing a semiconductor substrate so that very thin oxides may be produced with excellent characteristics and with excellent uniformity.

It is an object of the invention to provide a method of processing a semiconductor substrate so that etching and reactions of silicon and silicon oxide can be carefully controlled.

SUMMARY OF THE INVENTION

The atmosphere surrounding a semiconductor substrate that is being rapidly thermally processed is carefully controlled so that a very small concentration of a reactant gas is used to stabilize the surface against excessive etching of the semiconductor and the thin oxides of the semiconductor, and against excessive growth of the semiconductor oxide.

DETAILED DESCRIPTION OF THE INVENTION

Silicon and $SiO_2$ interface chemistry

Figure 1:
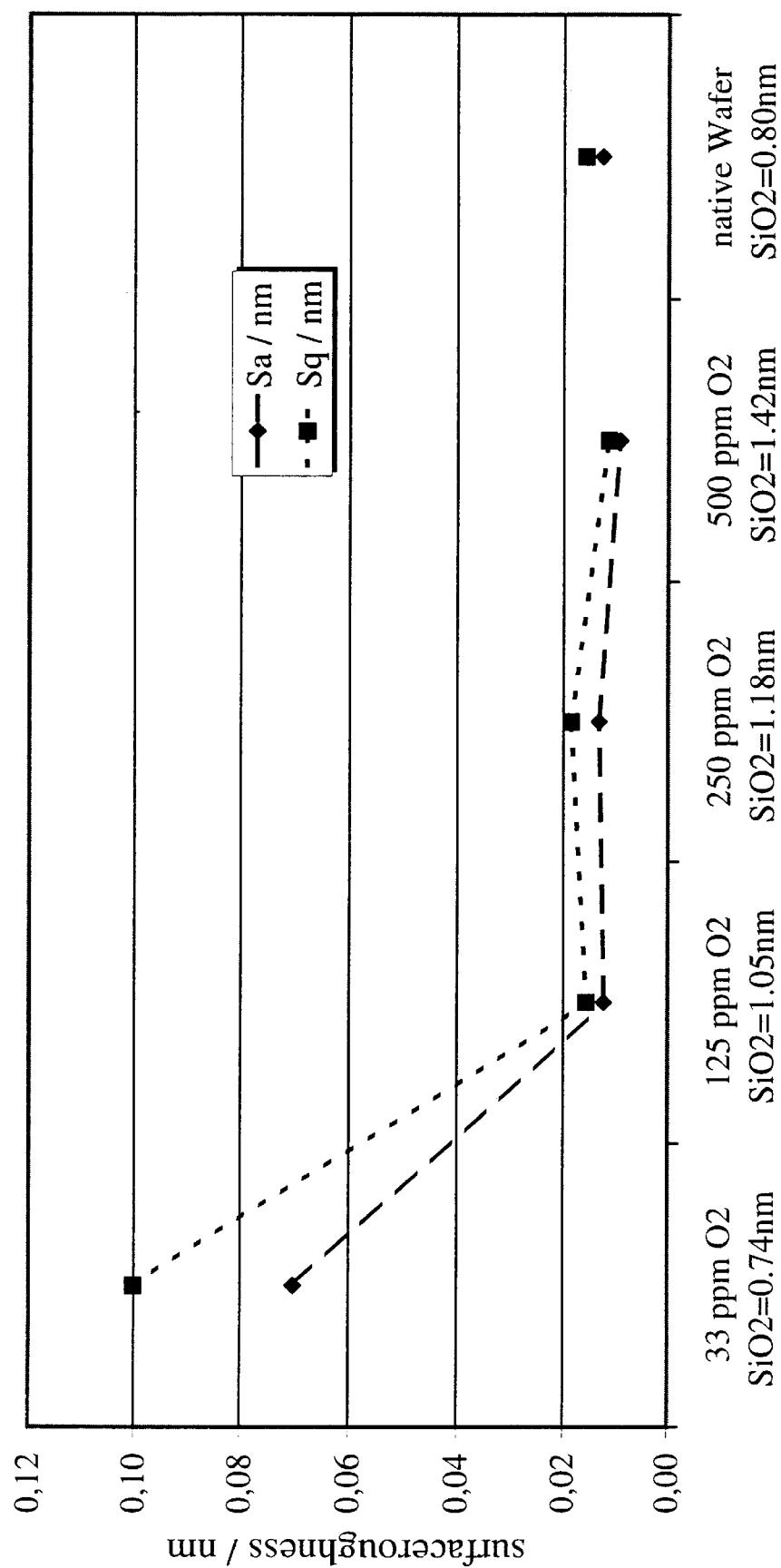
FIG. 1 shows the surface roughness of a wafer annealed for 30 sec at 1050 C. as a function of amount of oxygen gas in a neutral ambient gas near 1 atmosphere pressure.

The chemical basis of the monolithic planar IC technology is that silicon reacts at high temperature with oxygen and the oxide ($SiO_2$), developed during the reaction, is a stable and uniform layer which protects the silicon surface and acts as a barrier against dopant diffusion. This oxide is called a thermal oxide to distinguish it from the oxide that forms on clean silicon at low temperatures which is called a "native oxide". A native oxide is not as "good" as a thermal oxide because the native oxide has many more states, or "dangling bonds", at the $Si$—$SiO_2$ interface. For completeness, a "good" oxide may be produced by chemical vapor deposition where little or no silicon from the interface is consumed. It has been discovered lately that, for RTP, the high temperature, short time $Si$—$SiO_2$ interface chemistry needs to be carefully evaluated in the low oxygen concentration range. What is more, the chemistry plays an important role even in case of UHV or neutral gas ambient annealing when oxide layers occur on the silicon surface or a $Si$—$SiO_2$ interface occurs on the device.

Depending on several factors (most importantly on temperature and oxygen concentration) silicon can have the following reactions with oxygen in a neutral atmospheric pressure ambient. At the "higher" partial pressures of oxygen a.) $Si+O_2 \rightarrow SiO_2(s)$ T>800° C. $[O_2](>500$ ppm)

In order to produce $SiO_2$ on the silicon surface, there must be a minimum oxygen concentration in an atmospheric neutral gas ambient. The minimum $O_2$ concentration depends, however, strongly on temperature, dopant concentration and wafer orientation and is about 500 ppm for relatively high temperatures above about 1100 C. (In case of low pressure (lower than atmospheric pressure) processes the corresponding partial pressure of the oxygen must be used. At one atmosphere ambient pressure, 500 ppm oxygen corresponds to a partial pressure of 0.38 torr.) The oxygen at the $SiO_2$ gas interface migrates through the oxide and reacts at the $Si$—$SiO_2$ interface to form $SiO_2$. At pressures of oxygen just above the minimum for producing $SiO_2$, the rate at which the $SiO_2$ is formed increases slowly with the concentration of oxygen.

At lower concentrations of oxygen, b.) $Si+\frac{1}{2}O_2 \rightarrow SiO(g)$ T>900° C. $[O_2]<500$ ppm In the case of very low oxygen concentration the silicon can not be oxidized to form $SiO_2$, as only silicon monoxide (SiO) forms. At temperatures above 900 C., SiO is volatile and escapes from the surface immediately. Any open silicon surface areas, even those which are covered with a native oxide, are etched by this reaction and silicon is consumed. We have found that the atomic surface roughness grows, that shallow implanted layers can partly or totally disappear and that SiO is deposited on the cooler parts of the reactor. For ultra shallow implanted regions such as regions implanted with boron, the thickness of the implanted region becomes smaller as the silicon is etched away, and the total amount of boron in the region becomes less as the boron seems to leave with the silicon. At the $Si$—$SiO_2$ interface at such low partial pressures of oxygen, c.) $SiO_2+Si \rightarrow 2SiO$ T>900° C. $[O_2]<500$ ppm On silicon surface parts where thermal $SiO_2$ is present, even if its thickness is only 10 nm, the thermal $SiO_2$ protects the surface from being etched macroscopically. However, Si atoms leave the $Si$—$SiO_2$ interface. The protective $SiO_2$ layer however cannot stop reaction c) at the interface. Dangling bonds will be created at the $Si$—$SiO_2$ interface and in the worst case micro voids and even pitting may appear.

We have found that we can control the above mentioned processes by using a very small concentration of reactive gases in the process gas when the silicon substrate is processed at high temperatures and short times. The minimum oxygen concentration, which can protect the interface from disproportioning, depends on several factors. These are e.g. wafer temperature, local oxide thickness, doping level at the silicon surface and other components in the process gas, such as $NH_3$, $H_2$, $H_2O$, $N_2$, NO, $NO_2$, Ar, etc.

It is important to note that all high temperature annealing steps, performed in an oxygen free ambient (also high and ultra high vacuum), lead to a certain degree of disproportioning at the $Si$—$SiO_2$ interface. Therefore, all post oxidation annealing steps must use at least a ppm level of reactive gases such as those noted.

Interface engineering

A detailed study of the interface reactions is particularly important for shallow and ultrashallow junction formation, for gate oxide formation and e.g. in case of boron phosphoro-silicate glass (BPSG) reflow when open windows are present in thick oxide on the wafer. In order to maintain the implanted shallow dopant profiles, process engineers often have to balance on the edge of the knife:

bare silicon surface parts are neither to be oxidized nor allowed to be etched. Oxidation leads to dopant segregation and anomalous diffusion. SiO creation results in etched surface and we deplete or remove the implanted surface layer. We have found to find a process window in the oxygen concentration where the silicon surface reactions are in a balance and only a few $SiO_2$ monolayers (2–3) grow on to the surface.

The oxide growth can be controlled by ellipsometrical measurement of the very thin oxide layer. Any surface etch by SiO creation can be revealed by atomic surface roughness measurements.

Experimental procedure

We annealed silicon wafers in AST-SHS-2800ε rapid thermal system at different temperatures and in $N_2$ ambient at different, very low oxygen concentrations. After annealing we measured the surface roughness by SFM (scanning force microscopy) to find out which oxygen concentration results in maximum surface roughness and what the minimum required oxygen concentration is to avoid surface etching. The SHS 2800ε RTP system can control process gas mixtures in ppm level.

Figure 2:
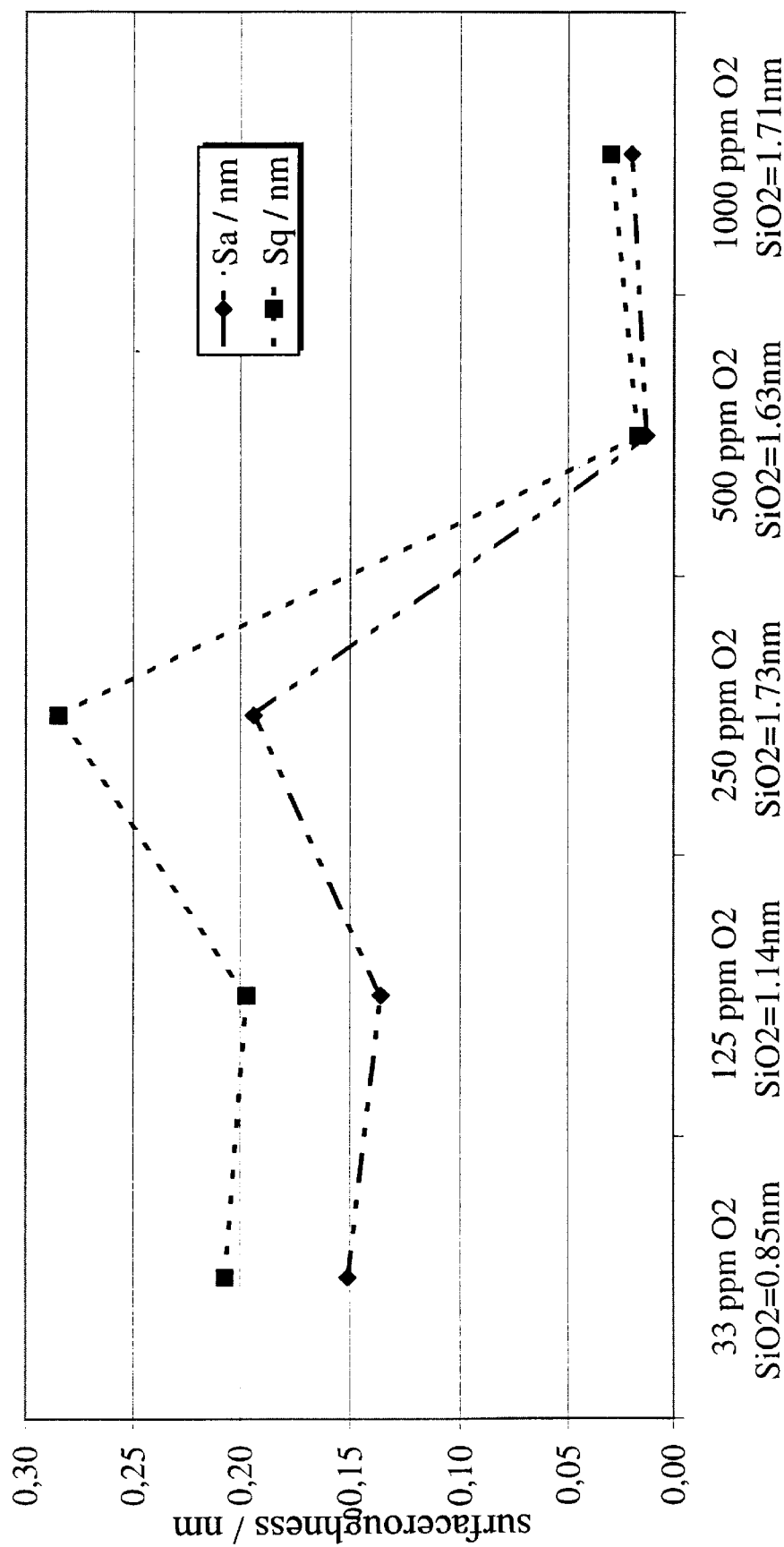
FIG. 2 shows the surface roughness of a wafer annealed for 30 sec at 1100 C. as a function of amount of oxygen gas in a neutral ambient gas near 1 atmosphere pressure.
Figure 3:
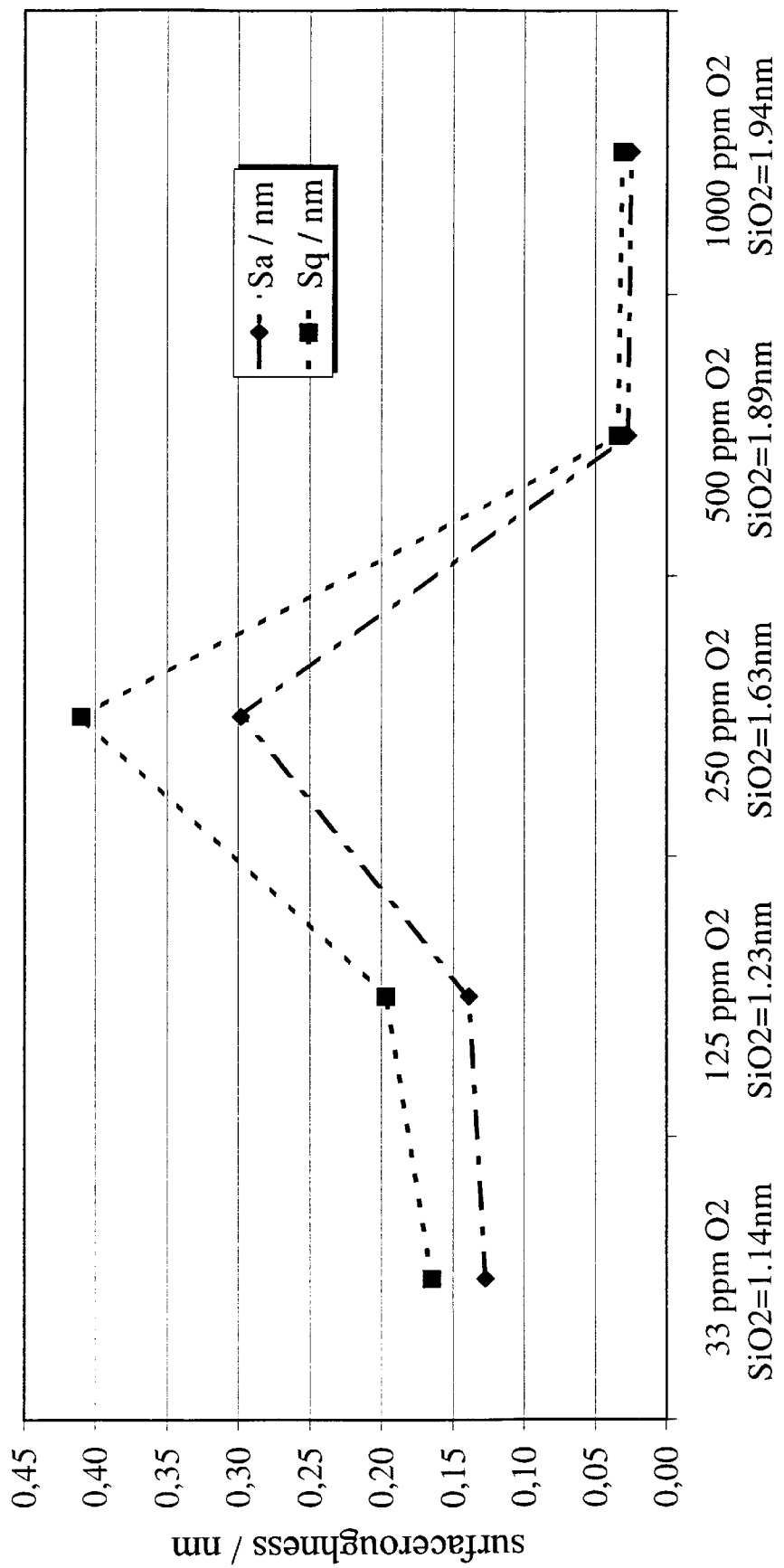
FIG. 3 shows the surface roughness of a wafer annealed for 30 sec at 1150 C. as a function of amount of oxygen gas in a neutral ambient gas near 1 atmosphere pressure.

The wafer specification for these experiments was: 150 mm prime CZ silicon wafer, 3–9 ohm-cm, n-type [100] orientation, from a freshly opened box. We did not use precleaning. The samples were annealed at 1050° C., 1100° C., and 1150° C. for 30 sec. We changed the oxygen concentration for each experiment and used 33, 125, 250, 500 and 1000 ppm O2 levels in a neutral gas with total pressure slightly exceeding one atmosphere. For the SFM investigations we used a Topometrix Explorer head and various tips. We performed the measurements in non-contact-mode. The roughness parameters were calculated from 1×1 μm spots. The average Sq (root mean square deviation of the surface) and Sa (arithmetic mean deviation of the surface) of the different experiments are plotted in FIG. 1, FIG. 2, and FIG. 3 for 30 sec anneals at 1050 C., 1100 C., and 1150 C. respectively. We illustrate the SFM surface characteristics after 1100° C.—30s rapid thermal oxidization (RTO) in cases of 250 ppm and 500 ppm oxygen concentration in FIGS. 4 and 5, respectively.

From our measurements we conclude the following:

a.) We can safely oxidize bare silicon wafers to $SiO_2$ at 1100° C. and 1150° C. when the annealing atmosphere contains at least 500 ppm (a partial pressure of 0.38 Torr) $O_2$. The minimum partial pressure necessary to produce the oxides and not etch the native oxide surfaces may be easily determined for the various combinations of temperature and process gas components by methods as shown above.

b.) At 1100° C. and 1150° C. we observed the strongest surface etch at 250 ppm $O_2$ concentration.

c.) At higher temperature the surface etch is much stronger.

d.) At 1050° C. $SiO_2$ was created already at 125 ppm O2 concentration. Surface etching took place at a lower oxygen level.

e) Thin oxide layers grow on implanted Si surfaces at a rate up to 1.5–2 times as fast as on bare silicon.

f) In case of implanted wafers which do not have screen oxide, we can expect, under common annealing conditions (and above 900° C.), a surface etch in the range of 1–100 ppm oxygen concentration. In such cases the mean sheet resistivity grows and the uniformity becomes worse. A formal ellipsometrical measurement of the native oxide distribution can also reveal surface etch. As the surface etches the native oxide uniformity becomes worse.

g) It is surprising how suddenly the Si—$SiO_2$ interface becomes "self curing" above a minimum oxygen concentration in the sub 1000 ppm level. Ultrathin $SiO_2$ layers of excellent quality and uniformity can be produced using high temperatures and very low oxygen concentrations. The native oxide can be cleaned off the wafer with a quick dip in HF, and the wafer surface remains passivated with H atoms for some time. When the wafer is then inserted into and heated in the RTP system with oxygen or an oxygen containing gas having a concentration above a minimum set by the temperature and other components of process gas, the wafer surface oxidizes and a well controlled thickness of oxide in the range of a few monolayers to 5 nm can be reliably produced.

h) Near surface Si atoms which are energetically at different levels are oxidized more uniformly at higher temperature. The ultrathin thickness e.g. in 0,5–5 nm range can be maintained by very low oxygen concentration either in low pressure or in neutral gas ambient such as nitrogen or argon. Controlled thermal kinetic processing method supports this technology.

i) Oxygen containing gases such as $H_2O$, NO, $NO_2$, have been tried, and show similar protective behavior as oxygen at low concentrations. Higher temperatures of 1200 C. and 1250 C. have also been tried and show similar behavior.

j) For each RTP process temperature, there exists a minimum level of oxygen or other reactive gas in the process gas which protects surface oxides and Si—$SiO_2$ interfaces from degradation. This level is best set by experimentation as set out in the preceding specification. The level is preferably between 0.01 Torr and 3 Torr partial pressure of Oxygen. The level is more preferably between 0.1 Torr and 1 Torr oxygen gas. Other reactive gases which we have tried include $NH_3$, $H_2$, $H_2O$, $N_2$, NO, $NO_2$. We expect that all reactive gases which react with silicon will give excellent and reproducible results when used at such low concentrations. This is especially important for oxynitride production, where a ratio of one atom of nitrogen to 100 atoms of oxygen at the Si—$SiO_2$ interface has been shown to be very valuable in $E^2PROM$ production.

h) Very low concentrations of $NH_3$ have been shown to have very well controlled etching characteristics.

We claim:

1. A method of producing an ultrathin oxide film by rapid thermal processing of a silicon substrate, comprising;

processing the silicon substrate, the substrate having a thickness of oxide film of from 0 to 5 nm, in an RTP system in an atmosphere comprising a concentration of oxygen containing reactive gas, the reactive gas having a partial pressure in the range of 0.01 Torr to 3 Torr, until the thickness of the oxide film has significantly increased and is in a range from 0.5 to 5 nm.

2. The method of claim 1, wherein the concentration is between 0.1 Torr and 1 Torr partial pressure oxygen gas.

3. The method of claim 1, wherein the concentration is between 0.01 Torr and 3 Torr partial pressure nitric oxide (NO) or nitrous oxide ($N_2O$).

4. The method of claim 3, wherein the atmosphere further comprises between 0.01 Torr and 3 Torr partial pressure oxygen gas.

5. The method of claim 4, wherein the partial pressure of oxygen gas is between 0.1 Torr and 1 Torr.

6. The method of claim 5, wherein the partial pressure of nitric oxide (NO) or nitrous oxide ($N_2O$) is between 0.1 Torr and 1 Torr partial pressure.

7. The method of claim 1, wherein the reactive gas further comprises between 0.01 Torr and 3 Torr partial pressure $NH_3$.

8. A method of producing an ultrathin oxide film preferable in a range of 0.5 nm up to 5 nm on a surface of a silicon wafer, comprising:

heating the wafer in an RTP system within a very low concentration of oxygen or oxygen containing reactive gas, either in low pressure or in neutral gas ambient, wherein said concentration is in a range of 0.02 Torr up to 3 Torr partial pressure of oxygen or oxygen containing gas.

9. The method of claim 8, comprising an additional step of removing the native oxide from the wafer before said heating.

10. The method of claim 8, wherein the wafer is heated to 1250 C. in said heating step.

11. The method of claim 8, wherein said oxygen containing reactive gas is oxygen.

12. The method of claim 8, wherein said oxygen containing reactive gas is nitric oxide (NO).

13. The method of claim 8, wherein said oxygen containing reactive gas is nitrous oxide (N2O).

14. The method claim 13, wherein said oxygen containing reactive gas further comprises oxygen gas of partial pressure between 0.02 Torr and 3 Torr.

15. The method of claim 14, wherein said oxygen containing reactive gas further comprises oxygen gas of partial pressure between 0.02 Torr and 3 Torr.

16. The method of claim 8, wherein said oxygen containing reactive gas comprises H2O.

17. The method of claim 8, wherein said oxygen containing reactive gas comprises NH3 gas of partial pressure between 0.02 Torr and 3 Torr.

* * * * *